United States Patent
Xu et al.

(10) Patent No.: US 10,927,005 B2
(45) Date of Patent: Feb. 23, 2021

(54) METHOD FOR MANUFACTURING DOUBLY RE-ENTRANT MICROSTRUCTURES

(71) Applicant: THE REGENTS OF THE UNIVERSITY OF CALIFORNIA, Oakland, CA (US)

(72) Inventors: Muchen Xu, Los Angeles, CA (US); Chang-Jin Kim, Beverly Hills, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 271 days.

(21) Appl. No.: 15/546,260

(22) PCT Filed: Jan. 21, 2016

(86) PCT No.: PCT/US2016/014285
§ 371 (c)(1),
(2) Date: Jul. 25, 2017

(87) PCT Pub. No.: WO2016/122959
PCT Pub. Date: Aug. 4, 2016

(65) Prior Publication Data
US 2018/0016136 A1 Jan. 18, 2018

Related U.S. Application Data

(60) Provisional application No. 62/107,969, filed on Jan. 26, 2015.

(51) Int. Cl.
*B81C 1/00* (2006.01)
*B81C 99/00* (2010.01)
(Continued)

(52) U.S. Cl.
CPC .......... *B81C 1/00373* (2013.01); *B29C 33/42* (2013.01); *B29C 33/44* (2013.01);
(Continued)

(58) Field of Classification Search
CPC ....... B29C 33/20; B81C 1/00; B81C 1/00357; B81C 1/00023; B81C 1/00111; B81C 1/00642
See application file for complete search history.

(56) References Cited

U.S. PATENT DOCUMENTS

| 6,168,737 B1 | 1/2001 | Poco et al. |
| 6,406,636 B1 | 6/2002 | Vaganov |

(Continued)

FOREIGN PATENT DOCUMENTS

| WO | 2012/100100 A2 | 7/2012 |
| WO | 2014/011609 A1 | 1/2014 |

OTHER PUBLICATIONS

PCT International Preliminary Report on Patentability (Chapter I of the Patent Cooperation Treaty) for PCT/US2016/014285, Applicant: The Regents of the University of California, Form PCT/IB/326 and 373, dated Feb. 1, 2018 (7 pages).

(Continued)

*Primary Examiner* — Timothy Kennedy
*Assistant Examiner* — Alexander A Wang
(74) *Attorney, Agent, or Firm* — Vista IP Law Group LLP (57) ABSTRACT

A method of making microstructures having re-entrant or doubly re-entrant topology includes forming a mold defining the negative surface features of the re-entrant or doubly re-entrant topology that is to be formed. In one embodiment, a soft or flowable material is formed on a first substrate and the mold is contacted with the same to form a solid, now positive surface having the re-entrant or doubly re-entrant topology. The mold is then released from the first substrate.

(Continued)

The microstructures are secured to a second, different substrate, and the first substrate is removed. Any residual microstructure material located between adjacent microstructures may be removed to form the separate microstructures on the second substrate. The second substrate may be thin and flexible any manipulated into useful or desired shapes having the microstructures on one side thereof.

20 Claims, 7 Drawing Sheets

(51) Int. Cl.
    *B29C 33/42*        (2006.01)
    *B29C 33/44*        (2006.01)
    *B29C 33/64*        (2006.01)

(52) U.S. Cl.
    CPC .......... *B29C 33/64* (2013.01); *B81C 1/00111* (2013.01); *B81C 1/00357* (2013.01); *B81C 1/00555* (2013.01); *B81C 99/0085* (2013.01); *B81B 2207/056* (2013.01); *B81C 2201/0198* (2013.01); *B81C 2201/036* (2013.01); *B81C 2203/0136* (2013.01); *B81C 2203/036* (2013.01); *B81C 2203/0757* (2013.01)

(56) References Cited

U.S. PATENT DOCUMENTS

| | | | |
|---|---|---|---|
| 6,692,680 | B2 | 2/2004 | Lee et al. |
| 7,531,120 | B2 | 5/2009 | Van Rijn et al. |
| 8,206,631 | B1 | 6/2012 | Sitti et al. |
| 8,229,075 | B2* | 7/2012 | Cowan ..................... G21B 1/19 378/143 |
| 2004/0241049 | A1* | 12/2004 | Carvalho .......... B01L 3/502707 422/400 |
| 2012/0126458 | A1 | 5/2012 | King et al. |
| 2013/0330501 | A1* | 12/2013 | Aizenberg .............. B08B 17/06 428/85 |
| 2014/0010994 | A1 | 1/2014 | Choi et al. |
| 2014/0011013 | A1 | 1/2014 | Jin et al. |
| 2014/0015900 | A1 | 1/2014 | Zhang et al. |
| 2015/0196940 | A1 | 7/2015 | Aizenberg et al. |
| 2016/0325536 | A1* | 11/2016 | Wolk ....................... B32B 3/30 |
| 2017/0369664 | A1* | 12/2017 | Brown ..................... C09D 7/63 |

OTHER PUBLICATIONS

Corrected version of PCT International Search Report for PCT/US2016/014285, Applicant: The Regents of the University of California, Form PCT/ISA/224, PCT/ISA/210, PCT/ISA/220 and PCT/ISA/237, dated Jan. 11, 2018 (9pages).

PCT International Search Report for PCT/US2016/014285, Applicant: The Regents of the University of California, Form PCT/ISA/210 and 220, dated Jun. 10, 2016 (5pages).

PCT Written Opinion of the International Search Authority for PCT/US2016/014285, Applicant: The Regents of the University of California, Form PCT/ISA/237, dated Jun. 10, 2016 (5pages).

Metal-organic 'micromushrooms' repel all, a clever chemical transformation yields surface-bound microstructures that efficiently drive away oil-and water-based contaminants, A*STAR Research, published online Apr. 9, 2014 (3pages).

Copic, Davor et al., Fabrication of high-aspect-ratio polymer microstructures and hierarchical textures using carbon nanotube composite master molds, Lab Chip, 2011, 11, 1831-1837.

Copic, Davor, Fabrication of Polymer and Nanocomposite Microstructures and Microactuators by Capillary Infiltration and Replica Molding, a dissertion submitted in partial fulfillment of the requirements for the degree of Doctor of Philosophy (Mechanical Engineering) in the University of Michigan, 2013 (130pages).

Del Campo, Aranzazu et al., Fabrication Approaches for Generating Complex Micro- and Nanopatterns on Polymeric Surfaces, Chem. Rev. 2008, 108, 911-945.

Golovin, Kevin et al., Transparent, Flexible, Superomniphobic Surfaces with Ultra-Low Contact Angle Hysteresis, Angew. Chem. Int. Ed. 2013, 52, 13007-13011.

Grigoryev, Anton et al., Superomniphobic Magnetic Microtextures with Remote Wetting Control, J. Am. Chem. Soc. 2012, 134, 12916-12919.

Hensel, Rene et al., Wetting Resistance at Its Topographical Limit: The Benefit of Mushroom and Serif T Structures, Langmuir 2013, 29, 1100-1112.

Hu, Huan et al., Hierarchically structured re-entrant microstructures for superhydrophobic surfaces with extremely low hysteresis, J. Micromech. Microeng. 24 (2014) 095023 (9pp).

Liu, Tingyi "Leo" et al., Turning a surface super-repellant even to completely wetting liquids, Science, vol. 346, No. 6213, pp. 1096-1100, Nov. 2014.

Ma, Ying et al., Fabrication of super-hydrophobic film from PMMA with intrinsic water contact angle below 90 degree, Polymer 48 (2007) 7455-7460.

Rykaczewski, Konrad et al., Dropwise Condensation of Low Surface Tension Fluids on Omniphobic Surfaces, Scientific Reports 4, Article No. 4158, doi:10.1038/srep04158, published: Mar. 5, 2014 (11pages).

Tuteja, Anish et al., Designing Superoleophobic Surfaces, Dec. 7, 2007, vol. 318, Science, 1618-1622, www.sciencemag.org.

Tuteja, Anish et al., Robust omniphobic surfaces, PNAS, Nov. 25, 2008, vol. 105., No. 47, 18200-18205.

Yuan, Lifang et al., Engineering Superlyophobic Surfaces on Curable Materials Based on Facile and Inexpensive Microfabrication, 17th International Conference on Miniaturized Systems for Chemistry and Life Sciences, Oct. 27-31, 2013, Freiburg, Germany, 1439-1441.

\* cited by examiner

Releasing and flipping

FIG. 7A

Residual layer removal

FIG. 7B

METHOD FOR MANUFACTURING DOUBLY RE-ENTRANT MICROSTRUCTURES

RELATED APPLICATION

This application is a U.S. National Stage filing under 35 U.S.C. § 371 of International Application No. PCT/US2016/014285, filed Jan. 21, 2016, which claims priority to U.S. Provisional Patent Application No. 62/107,969 filed on Jan. 26, 2015, which are hereby incorporated by reference. Priority is claimed pursuant to 35 U.S.C. §§ 119, 371 and any other applicable statute.

FIELD OF THE INVENTION

The technical field generally relates to surfaces that contain re-entrant or doubly re-entrant microstructures thereon and methods of making the same.

BACKGROUND OF THE INVENTION

Figure 1A:
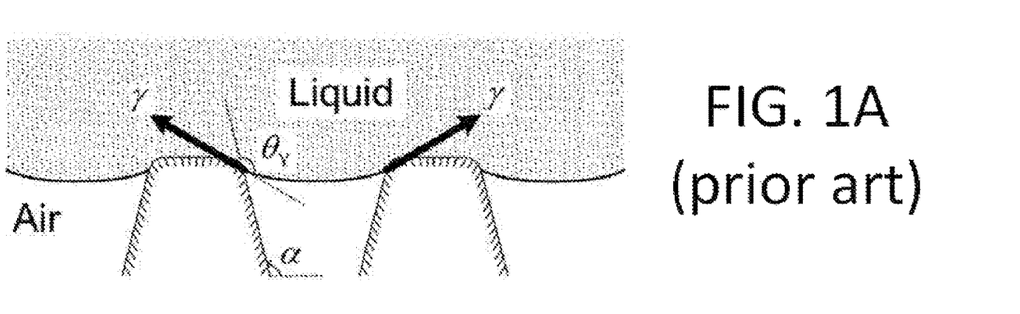
FIG. 1A illustrates a common type of superhydrophobic surface using a simple representative topology (prior art). Two microstructures are illustrated with a liquid disposed atop the microstructure.
Figure 1B:
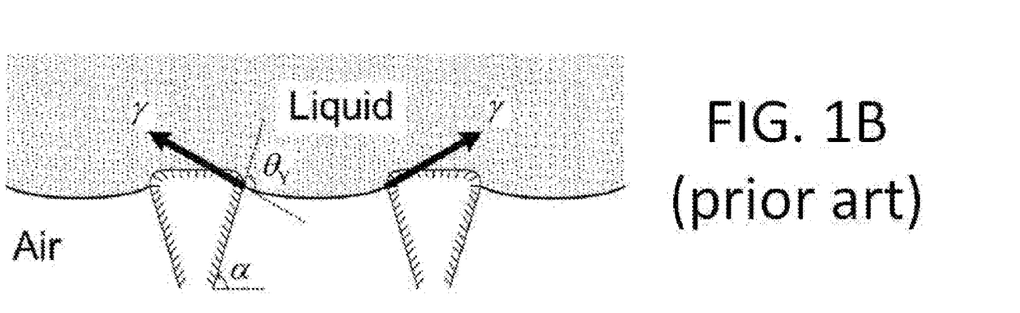
FIG. 1B illustrates a superhydrophobic surface with re-entrant topology using a simple representative topology (prior art). Two microstructures are illustrated with a liquid disposed atop the microstructure.

Inspired by natural surfaces such as lotus leaves and Nepenthes pitcher plants, researchers have been developing artificial surfaces to repel liquids superbly—much more strongly than conventionally expected. Mimicking lotus leaves, super-water-repellent surfaces have been made by combining a simple microscale roughness to a hydrophobic material so that water beads up into near-spherical droplets, which roll on or even bounce off the surface. This type of common superhydrophobic surface can be represented by a simple surface structure shown, for example, in a generalized simple topology of FIG. 1A, where $\gamma$ is the surface tension of the liquid; $\theta_Y$ is the Young's or intrinsic contact angle of the liquid on the solid material (i.e., assuming smooth surface); and $\alpha$ is the angle of the side slope of the microstructures with respect to the horizontal plane. For FIG. 1A, the side slope is positive, i.e., $90°\leq\alpha\leq180°$. To repel liquids that are more difficult to repel than water, such as oils and organic solvents, microstructures with a re-entrant topology (i.e., with a negative side slope with $0°\leq\alpha\leq90°$) as shown in a generalized form of FIG. 1B are needed so that liquids can be suspended on top of the microstructures by upward-pointing surface tension. This type of superhydrophobic surface is often referred to as superoleophobic or a superlyophobic surface. However, such an approach is not effective if the liquid has a surface tension smaller than 15 mN/m, which includes some fluorinated solvents. See Grigoryev et al., "Superomniphobic magnetic microtextures with remote wetting control," *Journal of American Chemical Society*, 134, pp. 12916-12919 (2012). This is because such extremely low energy liquids wet any existing solid material (including even polytetrafluoroethylene or PTFE, best known as Teflon®, which has one of the lowest surface energies) so well (i.e., their intrinsic or Young's angle $\theta_Y<10°$) that the upward pointing component of their surface tension is simply not large enough to suspend liquid droplets even on the extreme re-entrant topology (i.e., flat overhang or $\alpha=0°$) shown in FIG. 1C. See Tuteja et al., "Designing superoleophobic surfaces," *Science*, vol. 318, pp. 1618-1622 (2007).

To further enhance the liquid repellency of microstructures, an overhang with a downward lip (a.k.a. doubly re-entrant topology) has been imagined to increase the upward-pointing component of surface tension. See Hensel et al., "Wetting resistance at its topographical limit: the benefit of mushroom and serif T structures," *Langmuir*, vol. 29, pp. 1110-1112 (2013). This type of liquid-repellent surface can be represented by a surface structure with a doubly re-entrant topology as shown in a generalized form of FIG. 2A. Following the definition in FIG. 1, one may considered the side slope angle of this doubly re-entrant topology to be: $-90°\leq\alpha\leq0°$. However, while reporting such surfaces found in nature and analyzing the microstructures for repelling pressure, researchers did not appreciate how their geometric intricacy (especially the doubly re-entrant portion of the overhang, i.e., the downwardly extending lip) is quantitatively related to the apparent contact angle a liquid will make on the microstructures.

More recently, researchers have demonstrated that an omniphobic surface can be created by forming certain doubly re-entrant shaped structures atop a surface. See Liu et al., "Turning a surface superrepellent even to completely wetting liquids," *Science*, vol. 346, pp. 1096-1100 (2014). Such structures have the ability to repel any liquid. These structures have industrial applicability in that they can repel any liquid (including Fluorinert™ FC-70, which has the lowest known surface tension in a standard condition), function at high temperatures, and remain unaffected by biofouling. In the publication described above, the doubly re-entrant structures resemble flat head nails. Underneath each flat head, a nanoscale thin and short curtain surrounds the top and extends down vertically. This downward overhang creates a reverse meniscus when a liquid is placed on and suspended between adjacent structures. The nail structures are spaced about 100 micrometers apart and resemble a serif letter "T" in cross-section. Note the downward overhang is designed to be thin and short, unlike that in Hensel et al.

A different kind of super-repellant surface may be worth noting here before looking at the manufacturing methods. Mimicking of Nepenthes pitcher plants led to a slippery liquid-infused porous surface (SLIPS), where a liquid is repelled by a thin layer of lubricating liquid infused on the porous surface. SLIPS can be considered a superoleophobic surface, as it can repel many low energy liquids. International Publication No. WO 2012/100100 illustrates one type of SLIPS structure. Limited by the working mechanism, however, SLIPS can only repel liquids that are immiscible to the lubricating liquid and have larger surface tension than the lubricating fluid. Therefore, using one of the fluorinated solvents (e.g., Fluorinert™ FC-70 available from 3M™) as the lubricating liquid, SLIPS provides stable repellency to aqueous and hydrocarbon liquids but not to other fluorinated solvents which would mix with the lubricating liquid. Furthermore, it is difficult to maintain the lubricating liquid in place on the surface for an extended time in most realistic conditions. Once the lubricating liquid is lost, it is hard to be replenished in practice.

The invention described herein discloses how to obtain superhydrophobic surfaces with microstructures similar to those by Liu et al. above, i.e., doubly re-entrant structures with downward overhangs that are substantially thin and short. Liu et al. formed such structures by using photolithography of silicon wafers along with thermal oxidation and reactive ion etching of silicon. Using a silicon dioxide mask, silicon was anisotropically etched by deep reactive ion etching followed by a silicon dioxide etch. The formed features were then coated with a hydrophobic coating such as $C_4F_8$, if necessary. However, the method of making doubly re-entrant shaped microstructures that is disclosed in Liu et al. is not necessarily compatible with common mass manufacturing techniques. New methods of manufacturing re-entrant and doubly re-entrant shaped structures on a surface are needed.

The mass manufacturing methods known to fabricate re-entrant microstructures, such as electrospinning (See Tuteja et al., "Designing superoleophobic surfaces," *Science*, vol. 318, pp. 1618-1622 (2007)), casting (See Yuan et al., "Engineering superlyophobic surfaces on curable materials based on facile and inexpensive microfabrication," *Journal of Materials Chemistry A*, vol. 2, pp. 6952-6959 (2014)), and polymer blending (See Ma et al., "Fabrication of super-hydrophobic film from PMMA with intrinsic water contact angle below 90 degrees," *Polymer*, vol. 48, pp. 7455-7460 (2007)), may also create topologies that may be categorized as doubly re-entrant. However, these manufacturing methods cannot produce the densely populated microstructures needed for the reverse menisci that may form in those doubly re-entrant structures to obtain radii of curvature small enough to assist in repelling the liquid. Importantly, these manufacturing methods cannot produce substantially thin and short vertical overhangs that resemble the overhangs of Liu et al.

SUMMARY

In one aspect of the invention, a molding-based fabrication method for manufacturing re-entrant or doubly re-entrant microstructures on a surface is disclosed. The method is low cost and scalable for mass manufacturing such structures. Typical molding processes cannot produce doubly re-entrant structures because the downward overhangs would prevent the doubly re-entrant structures from being freed from the mold. Casting processes would encounter similar problems. As described herein, the methods disclosed herein overcome this limitation by first making the main microstructures upside down by using a mold and then securing the trunk of the main microstructures to the final substrate while the initial substrate used during the molding or casting process is removed.

In one aspect of the invention, a method of making microstructures having re-entrant or doubly re-entrant topology includes forming a rigid mold defining the negative surface features of the re-entrant or doubly re-entrant topology and applying a soft or flowable material on a surface of a first substrate. The rigid mold is contacted against the surface to interpose the soft or flowable material between the surface of the rigid mold containing the negative surface features and the first substrate. The rigid mold is then released from the first substrate after the soft or flowable material forms solid microstructures (e.g., after cooling down for a period of time for hot embossing) having re-entrant or doubly re-entrant topology. The solid microstructures are then secured to a second substrate, and the first substrate is removed. In some cases, a residual layer of the microstructural material left between adjacent microstructures may need to be removed to form the separate microstructures on the second substrate.

In another aspect of the invention, a method of making microstructures having re-entrant or doubly re-entrant topology includes forming a mold defining the negative surface features of the re-entrant or doubly re-entrant topology and placing the surface of the mold defining the negative surface features against a first substrate. The spaces or voids between the mold and the first substrate are then filled with a microstructure material by growing or depositing the microstructure material within the spaces. The mold is then released from the first substrate after the structural material forms the microstructures having re-entrant or doubly re-entrant topology. The microstructures are then secured to a second substrate, and the first substrate is removed. In some cases, a residual layer of the microstructure material between adjacent microstructures may need to be removed to form the separate microstructures on the second substrate.

In another aspect of the invention, a mold for manufacturing microstructures having re-entrant or doubly re-entrant topology includes a rigid body having a contact surface on one side thereof, the contact surface having formed therein a plurality of repeating negative surface features defining the re-entrant or doubly re-entrant topology, wherein the density of surface features is at least 1 per millimeter along at least one direction of the contact surface.

DETAILED DESCRIPTION OF THE ILLUSTRATED EMBODIMENTS

Figure 2A:
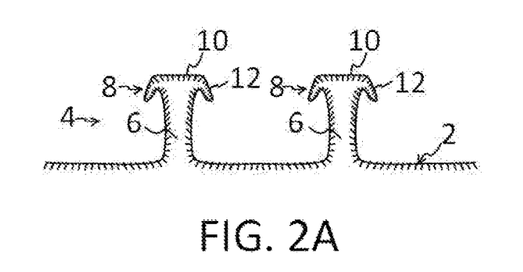
FIG. 2A illustrates a cross-sectional view of a representative superhydrophobic surface with microstructures having doubly re-entrant topology.

FIG. 2A illustrates an exemplary embodiment of a surface 2 that contains thereon a plurality of microstructures 4 that have a doubly re-entrant topology. The term "microstructures" as used herein include structures that have small features that have dimensions measured in the micrometer or even nanometer range. Each of the microstructures 4 includes a trunk 6 that extends generally perpendicularly away from the surface 2 and a terminal structure 8 having a doubly re-entrant topology capping or topping the trunk 6. The terminal structure 8 includes a cap portion 10 and a downwardly extending overhang or lip 12 that extends downward (toward the surface 2) from the entire periphery of the cap portion 10.

In some embodiments, the cap portion 10 may be substantially planar and generally parallel to the surface 2 as illustrated or the cap portion 10 may be curbed or bulbous in other embodiments. The lip 12 circumscribes the entire periphery of the cap portion 10 and does not contain any breaks or discontinuities. The lip 12 is generally oriented in a downward orientation toward to the surface 2 and may be angled relative to the plane of the surface 2 (as illustrated) or substantially orthogonal to the plane of the surface 2. The lip 12 is preferably thin (<100 microns) and may terminate at either a blunt or sharpened edge.

Figure 2B:
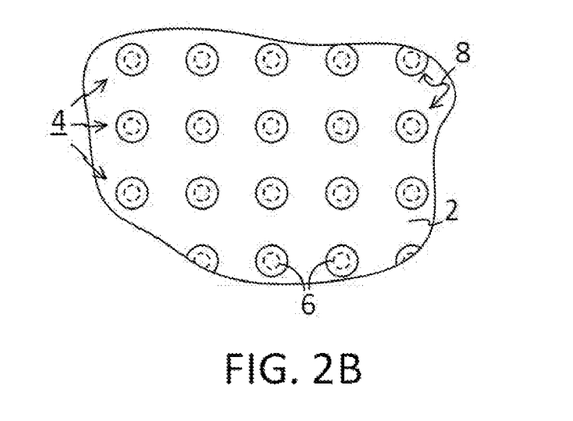
FIG. 2B illustrates a top down view of a surface having an array of microstructures (i.e., posts) having doubly re-entrant topology disposed thereon.
Figure 2C:
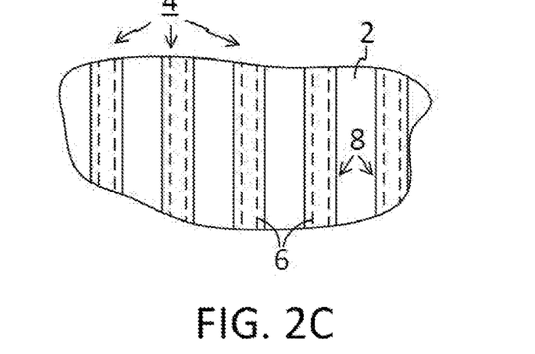
FIG. 2C illustrates a top down view of a surface having a different array of microstructures (i.e., gratings) having doubly re-entrant topology disposed thereon.

One significant advantage over prior art fabrication methods is that a surface 2 may be formed with microstructures 4 with high density as illustrated in FIG. 2B and FIG. 2C. For example, the density of the microstructures 4 on the surface 2 may be greater (i.e., denser) than about $1/mm^2$ for the two-dimensional array of FIG. 2B and $1/mm$ for the one-dimensional array of FIG. 2C. The density of the microstructures 4 on the surface 2 may be uniform across the entire surface 2 or, alternatively, the density of microstructures 4 may vary across one or more regions or areas of the surface 2. The density of the microstructures 4 as well as the patterning of the microstructures 4 is controlled by the contact surface of the fabricated mold 14 as disclosed below.

Figure 3:
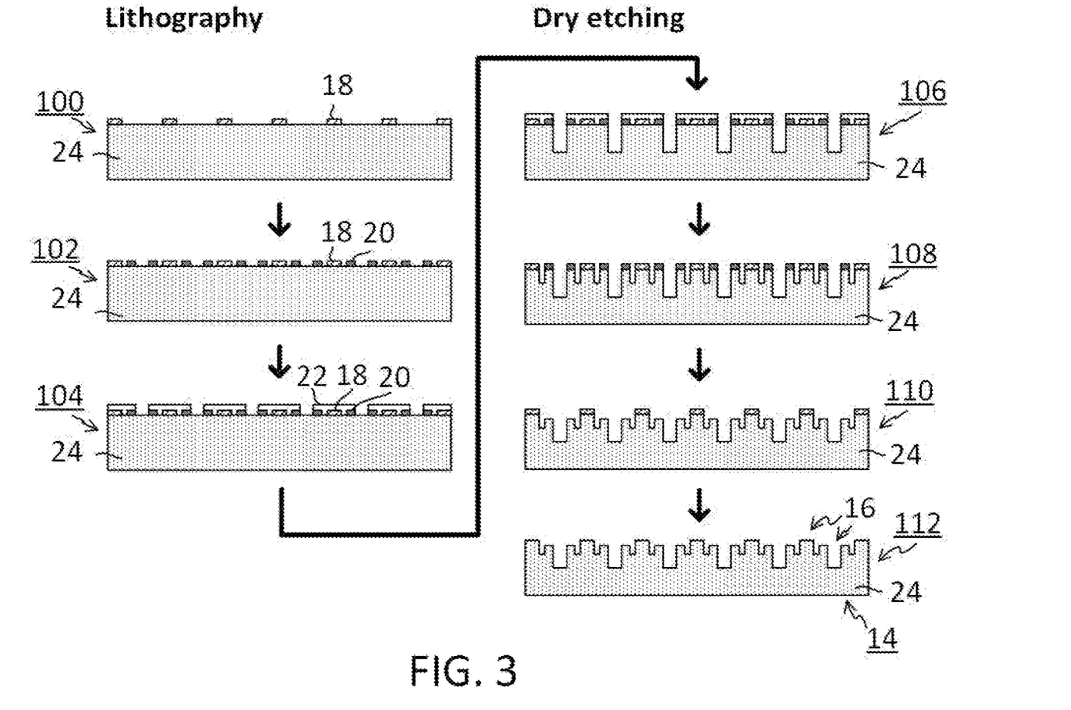
FIG. 3 illustrates one embodiment of a fabrication process that makes a mold used to manufacture microstructures having re-entrant or doubly re-entrant topology.

FIG. 3 describes one embodiment of fabricating a mold 14 that is used to form the microstructures 4 using microelectro-mechanical systems (MEMS) fabrication techniques. According to this embodiment, the mold 14 is formed as body with a contact surface having negative surface features or mold features 16 formed therein that are the reverse or "negative" image of the intended doubly re-entrant (or re-entrant) microstructures 4. The shape or configuration of the microstructures 4 can take the form of posts, gratings, meshes, or the like as well as combinations thereof. The actual shape of the microfeatures 4 are the "positive" or intended shape of the doubly re-entrant (or re-entrant) microstructures 4 and are formed by material that occupies the "negative" spaces or voids defined by the mold features 16 in the contact surface of the mold 14.

Referring back to FIG. 3, in operations 100, 102, and 104 three lithography steps are used to define respective masks 18, 20, and 22 on a substrate 24 typically made of silicon or silica (glass). The materials for masks 18, 20, and 22 could be silicon dioxide, silicon nitride, photoresist, or other materials commonly used in semiconductor or MEMS fabrication techniques. After forming the masks 18, 20, and 22 on the substrate 24, the mold features 16 are obtained by deep reactive ion (DRIE) of the substrate 24 using the corresponding masks, as shown in operations 106, 108, 110, and 112. In the illustrated sequence, successive layers of masks 18, 20, and 22 are removed (operations 106, 108, and 110) followed by an anisotropic etch process (operation 112) to define the final mold features 16 within the substrate 24. Different combinations are possible between the three lithography steps 100, 102, 104 and the three respective DRIE steps 106, 108, 110. In addition to the lithographic method illustrated with FIG. 3, the mold 14 can also be fabricated from other materials and by other methods, such as milling with miniature tools, laser machining, electro-discharge machining (EDM), ion beam machining, electron beam machining, electroplating, etc. Regardless of the process that is used to form the mold 14, the mold 14 is substantially rigid and has the mold features 16, which is the negative of the microstructures 4, formed on one side thereof.

Figure 4A:
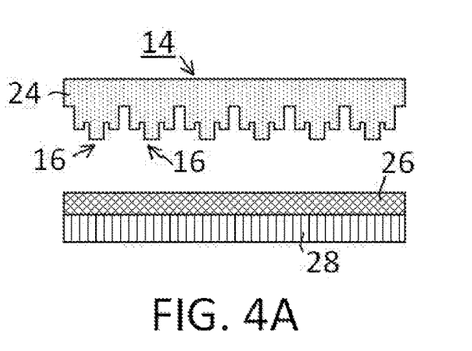
FIGS. 4A-4C illustrate one embodiment of a molding or casting process used to manufacture microstructures having re-entrant or doubly re-entrant topology.
Figure 4B:
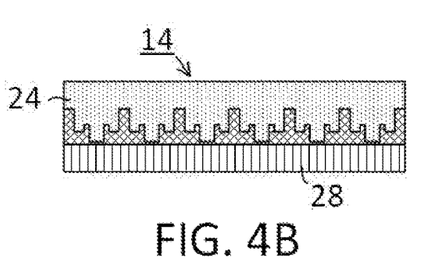
Figure 4C:
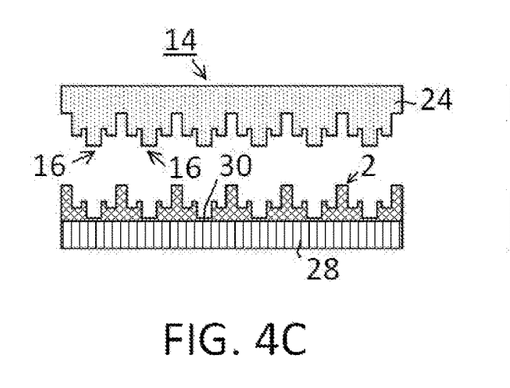

FIGS. 4A-4F illustrate the molding and casting process that utilizes the mold 14 that is created after the process illustrated in FIG. 3. In the molding or casting process, a material 26 such as a glass, metal, polymer such as silicone, polycarbonate, polyethylene, polymethyl methacrylate, fluoropolymer including polytetrafluoroethylene (PTFE), in a soft or liquid form is placed on a first substrate 28. The first substrate 28 may be made from any substantially rigid materials such as metal, ceramic including glass, and hard plastic. In some embodiments, the material 26 may need to be heated above its respective glass transition or melting temperature to form a flowable material in a soft or liquid state, as shown in FIG. 4A. For example, the material 26 may be deposited onto the substrate 28 as a solid which is then heated above its glass transition or melting temperature whereby it becomes a flowable or soft. Of course, the material 26 may be applied to the substrate 28 in a flowable or soft state. Regardless of the manner in which its flowable or soft state is achieved, the rigid mold 14 is then brought into contact with the substrate 28 containing the flowable or soft material 26 which is then shaped by the mold features 16 contained on the contact face of the rigid mold 14 and then solidifies to form microstructures 4 in an upside down orientation, as shown in FIG. 4B. One or both of the rigid mold 14 and the substrate 28 may be moved to contact one another to create the shaped surface. For example, the substrate 28 may be held in a fixture or chuck and the mold 14 may be pressed against the substrate 28 (or vice versa). The weight of the mold 14 itself may be sufficient to shape the flowable or soft material 26 although in other embodiments, force or pressure is applied to the mold 14 and/or substrate 28 for a period of time. In some embodiments, the mold 14 and the substrate 28 may be cooled for a period of time to aid in the solidification of the material 26 into the microstructures 4. This may include leaving the mold 14 and substrate 28 secured to one another in ambient temperature or some sort of active cooling may be applied to one or both of the mold 14 and substrate 28. The mold 14 is then removed or parted from the now formed positively defined microstructures 4 and bonded substrate 28 as illustrated in FIG. 4C. The rigid mold 14 may be formed from a number of materials including silicon, silica, or a metal. This process may leave a residual layer 30 located between microstructures 4 at the bottom of the molding material 26 on substrate 28 that is later removed as described herein.

Figure 4D:
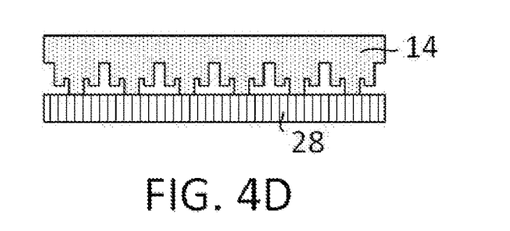
FIGS. 4D-4F illustrate another embodiment of a molding process used to manufacture microstructures having re-entrant or doubly re-entrant topology.
Figure 4E:
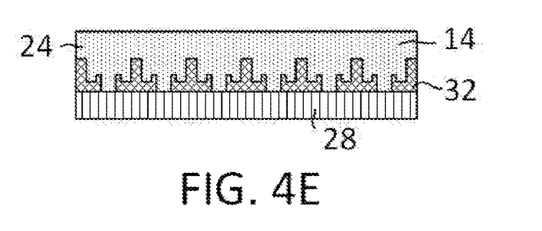
Figure 4F:
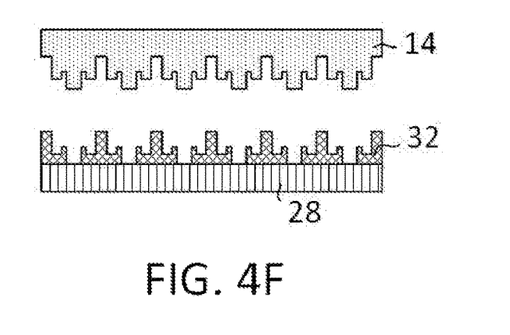

Alternatively, a mold 14 is first placed against a first substrate 28 as seen in FIG. 4D, and then a microstructure material 32 is filled (e.g., injected, grown or otherwise deposited) within the spaces formed between the mold 14 and the substrate 28 as seen in FIG. 4E. The microstructure material 32 may be a metal, a ceramic, or a polymer and grown within the spaces by injection molding, electroplating, electro-less plating, precipitation, condensation, etc. For instance, a polymer melt can be injected into the spaces or voids to form polymer microstructures 4. A polymer solution may also be polymerized in-situ within the spaces formed between the mold 14 and the substrate 28. For example, a polymer solution or fluid may contain a photoinitiator for polymerization and ultraviolet (UV) light is passed through an optically transparent mold 14 or substrate 28 to polymerize the microstructure material 32. If mold 14 is electrically conductive, a metal can be grown by electroplating to form metal microstructures 4. If the mold 14 is not electrically conductive, a metal can be grown by electro-less plating also known as autocatalytic plating to form metal microstructures 4. In yet another alternative, the mold 14 can be first filled with a material 32 of the microstructures 4. Then, the filling material 32 can be planarized by for example polishing its free surface and then bonding the structure with the substrate 28.

Figure 2D:
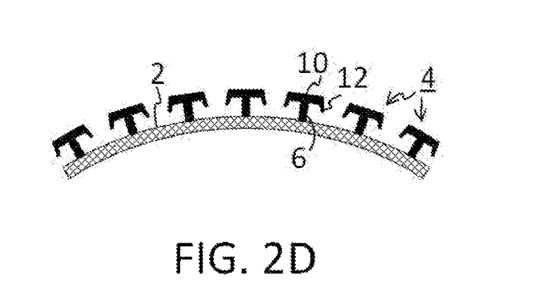
FIG. 2D illustrates a cross-sectional view of a flexible superhydrophobic surface with microstructures having doubly re-entrant topology.
Figure 5A:
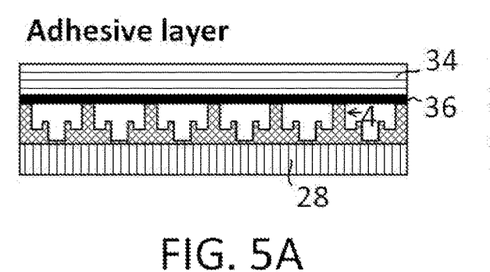
FIG. 5A illustrates a bonding process used to secure microstructures to a second substrate using an adhesive layer on the second substrate.
Figure 5B:
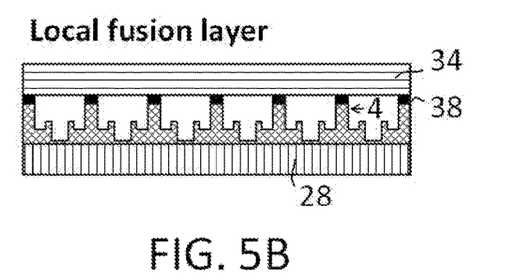
FIG. 5B illustrates a bonding process used to secure microstructures to a second substrate using a local fusion layer on the microstructures.
Figure 5C:
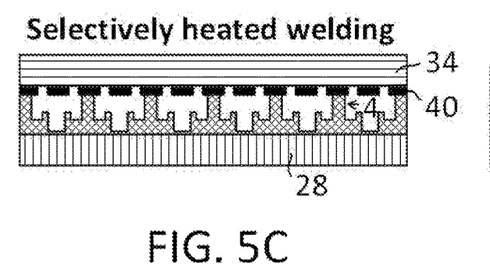
FIG. 5C illustrates a bonding process used to secure microstructures to a second substrate using a selectively heated welding.
Figure 5D:
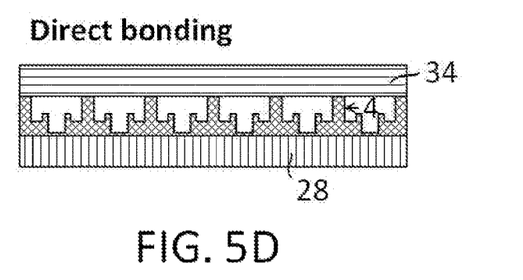
FIG. 5D illustrates a bonding process used to secure microstructures to a second substrate using direct bonding.

FIGS. 5A-5D illustrates different bonding processes that may be used to attach or secure the microstructures 4 to another separate or second substrate 34. As seen in FIGS. 5A-5D, the "top" surfaces of the now molded microstructures 4 are bonded onto the separate substrate 34. While reference is made to the "top" surfaces it should be understood that depending on the orientation of the structures at any given moment, they may also be the bottom surfaces. Regardless of the orientation of the structure containing the microstructures 4 and the substrate 34, the separate substrate 34 is bonded to the base or terminal end of the trunks 6 (as seen in FIG. 2). The bonding may be done using, but not limited to, an adhesive layer on the second substrate 34 as illustrated in FIG. 5A, local fusion layer on the microstructures 4 as illustrated in FIG. 5B, selectively heated welding as seen in FIG. 5C, or direct bonding as illustrated in FIG. 5D. The second substrate 34 may optionally be a substrate that is more flexible and/or thinner than the first substrate 28. For example, the second substrate 34 may also be a flexible substrate than is able to bend or flexed as is illustrated in FIG. 2D. For example, the second substrate 34 may be used to form useful shapes or contours that have the microstructures 4 formed on the exterior surface thereof.

Figure 6A:
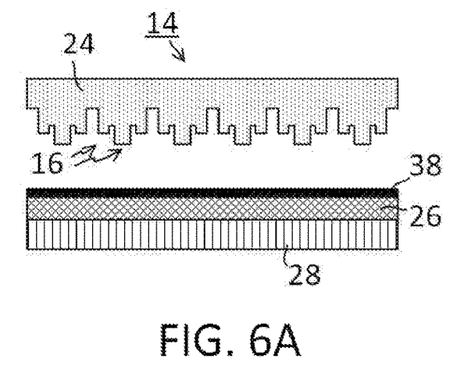
FIGS. 6A-6C illustrate a molding process used to make microstructures that can be bonded using a local fusion layer as shown in FIG. 5B.
Figure 6B:
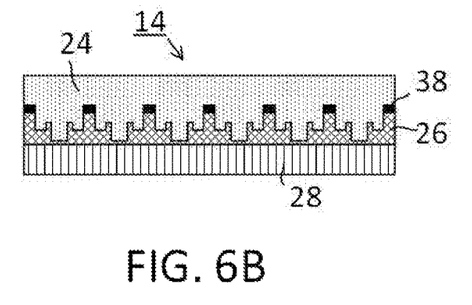
Figure 6C:
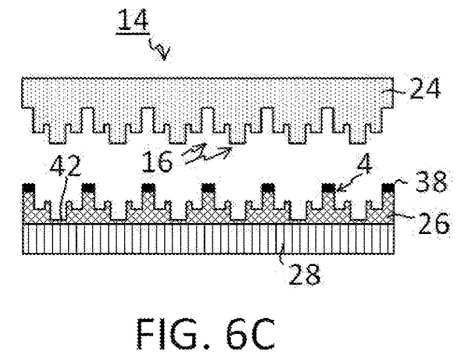

In the bonding using an adhesive layer shown in FIG. 5A, an adhesive 36 on the second substrate 34 is used to bond the terminal ends of the trunks 6 of the microstructures 4 onto the substrate 34. For the bonding using a local fusion layer as shown in FIG. 5B, the microstructures 4 have a thin bonding material 38 located at the terminal ends of the trunks 6 (described in more detail in FIGS. 6A and 6B) chosen so that the melting or glass transition temperature of bonding material 38 is lower than that of material used for the microstructures 4. For instance, the bonding material 38 could be Teflon® FEP (fluorinated ethylene propylene) and material for the microstructures 4 could be Teflon® PFA (perfluoroalkoxy). The process of preparing the sample is described later with FIGS. 6A-6C. In FIG. 5B, the sample is heated above the melting or glass transition temperature of the bonding material 38 but lower than that of material of the microstructures 4 to form a bond between the microstructures 4 and the substrate 34 without altering or damaging the microstructures 4. In one embodiment of bonding using selectively heated welding as shown in FIG. 5C, metal flakes 40 are placed on the surface of the substrate 34 before the substrate 28 mounted with the microstructures 4 is placed against the substrate 34 covered with the metal flakes 40. Then, microwave energy is applied to selectively heat and melt the metal flakes 40 so that the microstructures 4 are bonded to substrate 34 without damaging or altering the microstructures 4 thermally. Other types of energy may be applied to cause the melting of the flakes (e.g., electrical or thermal energy). FIG. 5D represents bonding methods that do not use a new material to glue. For one example, one or both of the bottom surface of the substrate 34 and the terminal ends of the trunks 6 of the microstructures 4 may be treated chemically, including a solvent, before bonding them directly. In another example, the substrate 34 may be heated above the glass transition or melting temperature of the microstructures 4 but below its own glass transition of melting temperature, while keeping the microstructures 4 cold. When the hot substrate 34 and the cold microstructures 4 are brought together, the terminal ends of the trunks 6 of the microstructures 4 melt and bond to the substrate 34 while the rest of the microstructures 4 stay relatively cool and not altered FIGS. 6A-6C illustrate a molding process that can be used in connection with the local fusion bonding to a separate substrate 34 such as that illustrated in FIG. 5B. In this method, a thin layer (e.g., 10 micrometers) of bonding material 38 is placed atop the material 26 used to form the microstructures 4 on the substrate 28. The microstructure material 26 and bonding material 38 may need to be heated above both of their respective glass transition or melting temperatures to form the soft or liquid state as shown in FIG. 6A. The rigid mold 14 is then brought into contact with the substrate 26 containing the soft or liquid material which is then shaped by the rigid mold 14 and then solidified to form microstructures 4 in an upside down orientation with the bonding material 38 remaining at the terminal ends of the trunks 6 of the microstructures 4 as seen in FIG. 6B. This remaining bonding material 38 can then be used in a local fusion bonding process such as that illustrated in FIG. 5B to bond a second substrate 34 to the microstructures 4 disposed on the first substrate 28.

For each of the embodiments illustrated in FIGS. 5A-5D, the first or initial substrate 28 is subsequently removed to complete the microstructures 4 on the second substrate 34, shown in FIG. 7B after flipping the sample upside down. It is often convenient to select the bonding force between the second (i.e., final) substrate 34 and microstructures 4 to be stronger than the bonding force between the first substrate 28 and microstructures 4, so that the first substrate 28 can be easily be removed while keeping microstructures 4 bonded to the second substrate 34. For instance, substrate 28 and substrate 34 can be made of different materials. For another instance, substrate 28 and substrate 34 can be of the same material except the surface of substrate 28 is rougher than that of substrate 34 so that the microstructures 4 adhere to the substrate 34 more strongly. The microstructures 4 may optionally be further coated with a conformal coating of hydrophobic material (e.g., polytetrafluoroethylene (PTFE)).

Figure 7A:
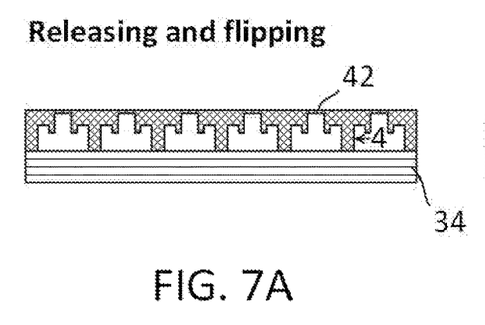
FIGS. 7A and 7B illustrate an embodiment of a process whereby a residual layer that remains between adjacent microstructures (FIG. 7A) is removed (FIG. 7B).
Figure 7B:
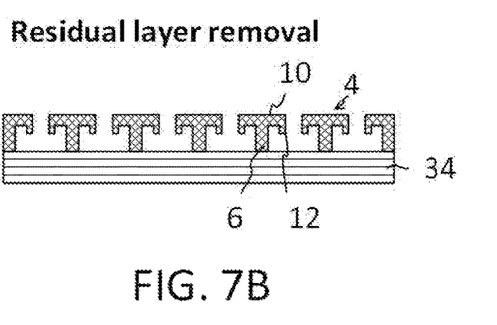

FIGS. 7A and 7B illustrate the process of removing the optional residual layer 42 in the event such a layer 42 was formed during the molding process illustrated in FIGS. 4A-4C or FIGS. 6A-6C. When the second substrate 34 containing the microstructures 4 is released from first substrate 28 and flipped as seen in FIG. 7A, there may be a residual layer 42 connecting between adjacent microstructures 4. If there is such a residual layer 42, this can be removed using a process such as plasma etching, wet chemical etching, mechanical polishing, and the like. The final state of the microstructures 4 is seen in FIG. 7B.

Figure 1C:
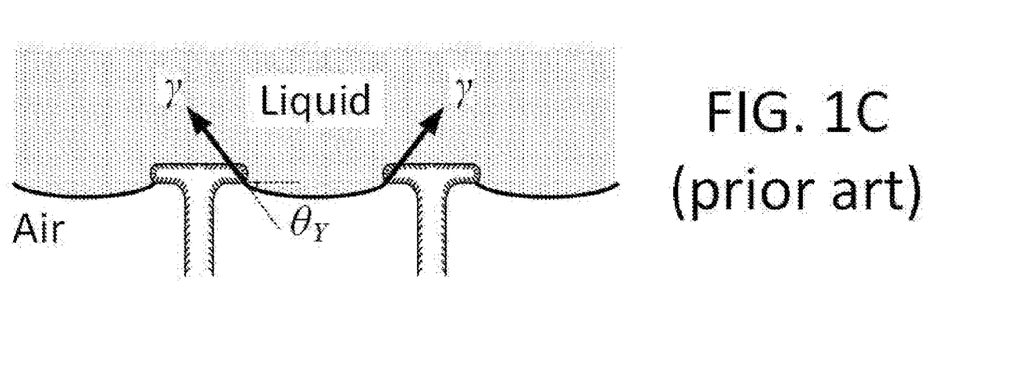
FIG. 1C illustrates a superhydrophobic surface with re-entrant topology using an extreme topology of flat overhang (i.e., $\alpha=0°$) (prior art). Two microstructures are illustrated with a liquid disposed atop the microstructure.

The fabrication processes described herein are primarily for doubly re-entrant microstructures represented in FIG. 2 but are also useful to fabricate re-entrant microstructures represented in FIGS. 1B and 1C. Such structures may be formed by modifying the mold features 16 of the mold 14. Note the re-entrant microstructures represented in FIG. 1B and especially FIG. 1C are not compatible with typical molding processes because the re-entrant topology does not allow demolding, either.

While embodiments of the present invention have been shown and described, various modifications may be made without departing from the scope of the present invention. The invention, therefore, should not be limited except to the following claims and their equivalents.

What is claimed is:

1. A method of making microstructures having doubly re-entrant shapes comprising:
forming a rigid mold defining negative surface features of the doubly re-entrant shapes;
applying flowable material on a surface of a first substrate;
physically placing the rigid mold against the surface of the first substrate to interpose the flowable material between the negative surface features of the rigid mold and the first substrate, wherein the flowable material solidifies to form positive surface features of the doubly re-entrant shapes as defined by the rigid mold;
physically parting the rigid mold from the first substrate, forming solid microstructures having the doubly re-entrant shapes disposed on the first substrate with a top portion of the microstructures being secured to the first substrate;
securing a bottom portion of the microstructures to a second substrate; and
removing the first substrate from the top portion of the microstructures to form the microstructures having the doubly re-entrant shapes on the second substrate.

2. The method of claim 1, wherein a residual layer of solidified flowable material connects adjacent tops of the microstructures and wherein the residual layer is removed by plasma etching, wet chemical etching, or mechanical polishing.

3. The method of claim 1, wherein the second substrate is flexible.

4. The method of claim 1, wherein the second substrate is made of the same material as the microstructures.

5. The method of claim 1, wherein the microstructures are secured to the second substrate through one of: an adhesive layer disposed on the second substrate; a local fusion layer on the microstructures; welds; or direct bonding.

6. The method of claim 1, further comprising conformally coating a hydrophobic material on the microstructures.

7. The method of claim 1, wherein the rigid mold is formed by applying a plurality of mask layers and anisotropic etching into the rigid mold to form the negative surface features of the doubly re-entrant shapes.

8. The method of claim 1, wherein the rigid mold comprises silicon or silica.

9. The method of claim 1, wherein the flowable material comprises a polymer.

10. The method of claim 9, wherein the polymer comprises one of silicone, polycarbonate, polyethylene, polymethyl methacrylate, and fluoropolymer.

11. A method of making microstructures having doubly re-entrant shapes comprising:
forming a rigid mold defining negative surface features of the doubly re-entrant shapes;
physically placing the surface of the rigid mold with the negative surface features against a first substrate, wherein spaces are formed between the negative surface features and the first substrate;
filling a material in the spaces between the negative surface features of the rigid mold and the first substrate, wherein the filled material forms positive surface features of the doubly re-entrant shapes as defined by the rigid mold;
physically parting the rigid mold from the first substrate, forming solid microstructures having the doubly re-entrant shapes disposed on the first substrate with a top portion of the microstructures being secured to the first substrate;
securing a bottom portion of the microstructures to a second substrate; and
removing the first substrate from the top portion of the microstructures to form the microstructures having the doubly re-entrant shapes on the second substrate.

12. The method of claim 11, wherein a residual layer of solidified flowable material connects adjacent tops of the microstructures and wherein the residual layer is removed by plasma etching, wet chemical etching, or mechanical polishing.

13. The method of claim 11, wherein the second substrate is flexible.

14. The method of claim 11, wherein the second substrate is made of the same material as the microstructures.

15. The method of claim 11, wherein the rigid mold is formed by applying a plurality of mask layers and anisotropic etching into the rigid mold to form the negative of the doubly re-entrant shapes.

16. The method of claim 11, wherein the rigid mold is made from silicon or silica.

17. The method of claim 11, wherein the filling material in the spaces between the negative surface features of the rigid mold and the first substrate comprises a metal.

18. The method of claim 11, wherein the filling material in the spaces between the negative surface features of the rigid mold and the first substrate comprises a condensable material.

19. The method of claim 11, wherein a hydrophobic material is coated conformally on the microstructures.

20. A method of making microstructures having doubly re-entrant shapes comprising:
forming a rigid mold defining negative surface features of the doubly re-entrant shapes;
applying flowable material on a surface of a first substrate;
physically placing the rigid mold against the surface of the first substrate to interpose the flowable material between the negative surface features of the rigid mold and the first substrate, wherein the flowable material solidifies to form positive surface features of the doubly re-entrant shapes as defined by the rigid mold;
physically parting the rigid mold from the first substrate, forming solid microstructures on the first substrate having the doubly re-entrant shapes that are free of any surrounding material between the solid microstructures, the solid microstructures disposed with a top portion of the microstructures being secured to the first substrate;
securing a bottom portion of the microstructures to a second substrate; and
physically removing the first substrate from the top portion of the microstructures to form the microstructures having the doubly re-entrant shapes on the second substrate.

* * * * *